US012768891B2

(12) United States Patent
Chou et al.

(10) Patent No.: US 12,768,891 B2
(45) Date of Patent: Oct. 20, 2026

(54) INTELLIGENT RISK PREVENTION MODE FOR ABNORMAL BATTERY TEMPERATURE PREDICTION

(71) Applicant: DELL PRODUCTS L.P., Round Rock, TX (US)

(72) Inventors: Shuo-Jung Chou, New Taipei City (TW); Tsz Leung, New Taipei City (TW); Chia-Fa Chang, New Taipei City (TW); Chien-Hao Chiu, Taoyuan City (TW); Wen-Yung Chang, Taoyuan City (TW); Yu-Chi Chin, Sunnyvale, CA (US)

(73) Assignee: Dell Products L.P., Round Rock, TX (US)

( * ) Notice: Subject to any disclaimer, the term of this patent is extended or adjusted under 35 U.S.C. 154(b) by 817 days.

(21) Appl. No.: 18/304,678

(22) Filed: Apr. 21, 2023

(65) Prior Publication Data

US 2024/0353494 A1 Oct. 24, 2024

(51) Int. Cl.

| | |
|---|---|
| ***G01R 31/36*** | (2020.01) |
| ***G01R 31/367*** | (2019.01) |
| ***G01R 31/374*** | (2019.01) |
| ***H02J 7/82*** | (2026.01) |
| ***H02J 7/90*** | (2026.01) |

(52) U.S. Cl.

CPC ....... *G01R 31/3648* (2013.01); *G01R 31/367* (2019.01); *G01R 31/374* (2019.01); *H02J 7/82* (2026.01); *H02J 7/977* (2026.01)

(58) Field of Classification Search

CPC ........................................................ H02J 7/00

See application file for complete search history.

(56) References Cited

U.S. PATENT DOCUMENTS

| | | | | |
|---|---|---|---|---|
| 5,633,573 A * | 5/1997 | van Phuoc | H01M 6/5011 320/152 |
| 8,338,011 B2 | 12/2012 | Tezuka et al. | |
| 10,601,085 B2 | 3/2020 | Lim | |
| 2022/0190619 A1 * | 6/2022 | Fasching | H02J 7/875 |

* cited by examiner

*Primary Examiner* — Robert Grant
(74) *Attorney, Agent, or Firm* — Larson Newman, LLP

(57) ABSTRACT

An information handling system determines that a relative state of charge (RSOC) on the battery is above a threshold RSOC. When the RSOC is above the RSOC threshold, the system determines that an initial temperature of the battery is within a first range, determines that a time rate of temperature increase on the battery is greater than a first slope, the first slope being determined based upon the first range, and discharges the battery to below the threshold RSOC in response to the determining that the time rate of temperature increase is greater than the first slope.

18 Claims, 4 Drawing Sheets

100

200

INTELLIGENT RISK PREVENTION MODE FOR ABNORMAL BATTERY TEMPERATURE PREDICTION

FIELD OF THE DISCLOSURE

This disclosure generally relates to information handling systems, and more particularly relates to providing intelligent risk prevention mode for abnormal battery temperature prediction.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may determine that a relative state of charge (RSOC) on a battery is above a threshold RSOC. When the RSOC is above the RSOC threshold, the system may determine that an initial temperature of the battery is within a first range, determine that a time rate of temperature increase on the battery is greater than a first slope, the first slope being determined based upon the first range, and discharge the battery to below the threshold RSOC in response to the determining that the time rate of temperature increase is greater than the first slope.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
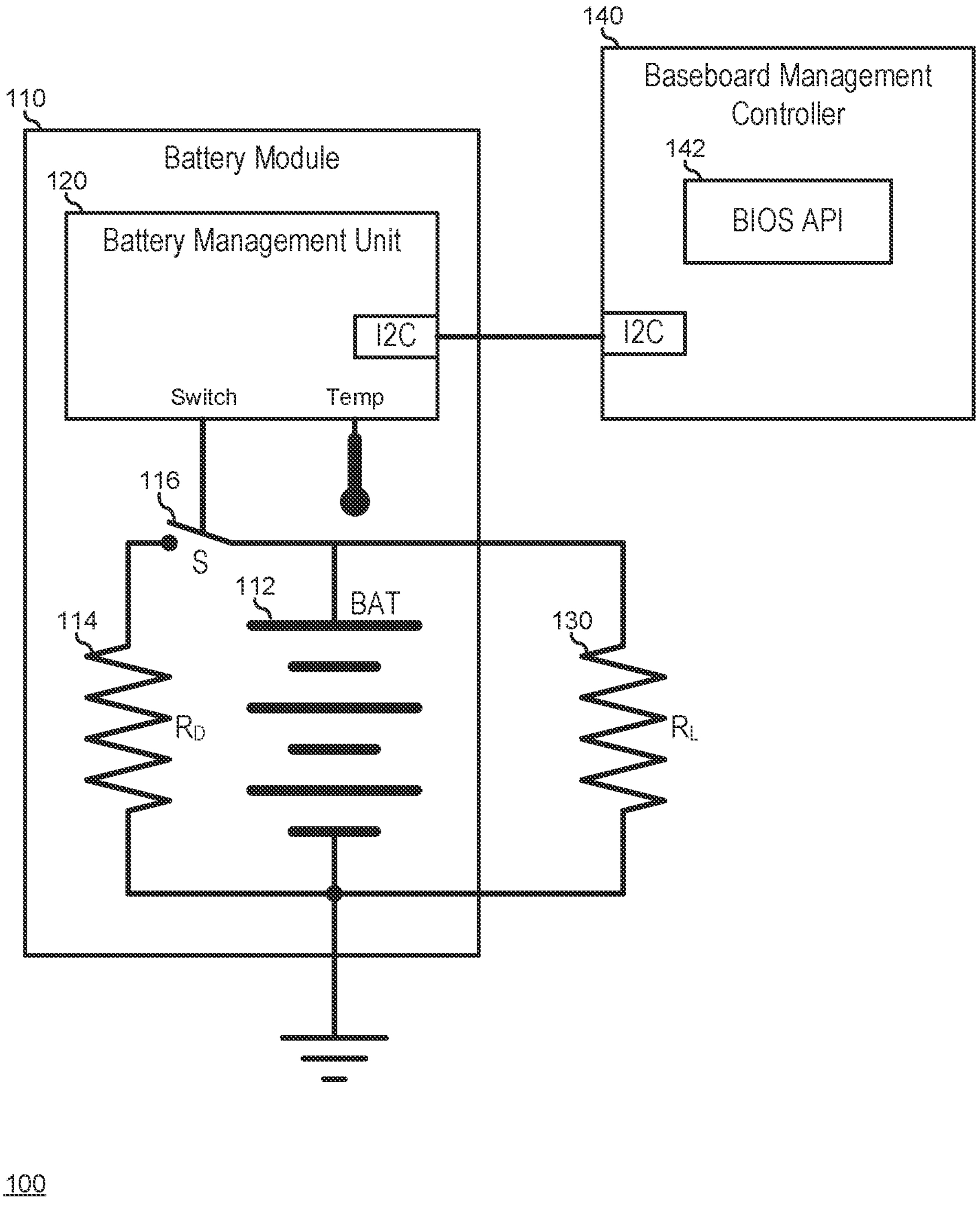
FIG. 1 is a block diagram of an information handling system configured to provide an abnormal battery temperature prediction (ABTP) mode according to an embodiment of the current disclosure.

FIG. 1 illustrates an information handling system 100 including a battery module 110 and a baseboard management controller 140. Information handling system 100 may be similar to information handling system 400, as described below. The functions and features of information handling system 100 may be represented by a load ($R_L$) 130 on battery 110. As such, load ($R_L$) 130 represents computing devices of information handling system 100, human interface devices, environmental control devices such as fans, coolant pumps, or the like, or any other device of the information handling system that utilized stored electrical energy from battery 110 to operate. Load 130 may operate in various modes where the electrical energy is provided from an external power source, such as an AC power adaptor or the like. The details of information handling system power consumption and the provision of electrical energy to an information handling system are known in the art and will not be further described herein, except as may be needed to illustrate the current embodiments.

Battery module 110 includes a battery 112 that is connected to load ($R_L$) 130, an internal battery management load (R) 114, and a switch(S) 116 to couple the internal load ($R_D$) to the battery as described further below. Battery 112 represents one or more individual battery cells configured in an arrangement to provide the power needs of information handling system 100, as needed or desired. The two or more battery cells may be arranged in a parallel configuration to provide a greater peak current capacity than would otherwise be available from a single battery cell. Further, two or more battery cells may be arranged in a series configuration to provide a greater battery voltage than would otherwise be available from a single battery cell. Other arrangements that combine parallel and series configurations may be utilized as needed or desired. The details of battery configurations and their applicability to the needs of information handling systems are known in the art and will not be further described herein, except as may be needed to illustrate the current embodiments.

Battery module 110 further includes a battery management unit (BMU) 120. BMU 120 operates to manage the power delivery provided by battery module 110. For example, BMU 120 operates to manage the charging and discharging of battery 112, to manage the charge state of the battery cells of the battery, to monitor the discharge rate of battery module 110, to monitor the temperature of the battery module, and to communicate with BMC 140 to provide battery related information to the BMC and to receive battery related commands from the BMC, as needed or desired. In communicating with BMC 140, BMU 120 may include a communication interface such as an Inter-Integrated Circuit (I2C) interface or another interface, as needed or desired. Under normal operating conditions, battery 112 provides current to load ($R_L$) 130, and switch(S) 116 remains open, such that no current flows in load ($R_D$) 114.

The inventors of the current disclosure have recognized that battery modules may be subject to swelling when the battery is highly charged and is further subjected to high ambient temperatures. In such cases, under the control of BMU 120, switch(S) 116 may be closed, such that a discharge current flows through load ($R_D$) 114, to lower the charge on battery 112 to reduce the risk of swilling. In a particular embodiment, BMU 120 operates to provide an abnormal battery temperature prediction (ABTP) mode. In this embodiment, BMU 120 operates to monitor the temperature of battery module 110 and the relative state of charge (RSOC) of battery 112. When the RSOC is above a particular threshold, such as above an 80% RSOC, BMU 120 measures temperature of battery module 110 at an initial time ($T_0$) and a time rate of temperature increase (m). If the time rate of temperature exceeds a particular rate, BMU 120 operates to discharge battery 112.

Figure 2:
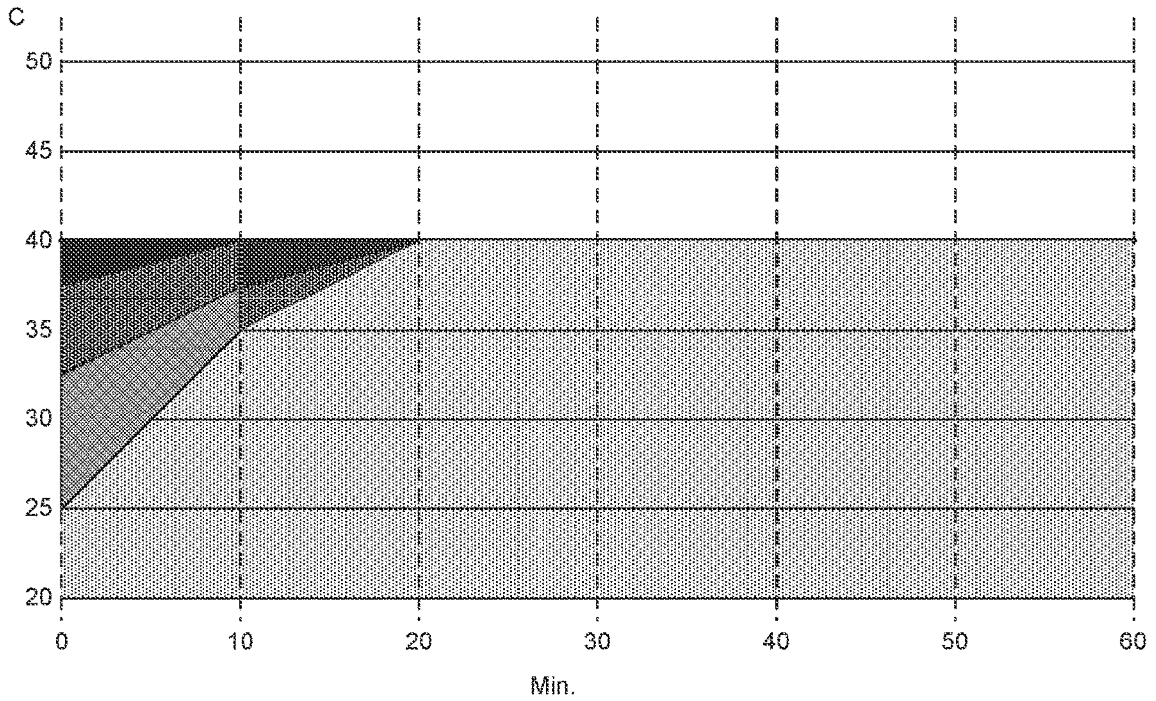
FIG. 2 illustrates a decision profile for monitoring battery temperature and providing for the discharge of a battery according to an embodiment of the current disclosure.

FIG. 2 illustrates an exemplary embodiment of a decision profile 200 for monitoring battery temperature and providing for the associated discharge of a battery that is over the RSOC threshold. For the sake of this example, the RSOC threshold may be assumed to be 80%, and a maximum battery temperature may be assumed to be 40 degrees ° C. An information handling system operates to determine an initial temperature for the battery and to monitor the rate of change of the temperature of the battery.

In a first time period, from time zero to ten (10) minutes, four zones are implemented: initial temperature is less than 25° C., initial temperature is between 25° C. and 32.5° C., initial temperature is between 32.5° C. and 35° C., and initial temperature is above 35° C. As illustrated, in the first zone where the initial temperature is below 25° C., the information handling system measures the rate of temperature increase, and if the rate of temperature increase is lower than 1° C. per minute (slope $m<1.0$), then no action is taken, but if the rate of temperature increase exceeds 1° C. per minute ($m>1.0$), then the information handling system operates to reduce the RSOC on the battery to below the RSOC threshold.

In the second zone where the initial temperature is between 25° C. and 32.5° C., if the rate of temperature increase is lower than 0.5° C. per minute (slope $m<0.5$), then no action is taken, but if the rate of temperature increase exceeds 0.5° C. per minute ($m>0.5$), then the information handling system operates to reduce the RSOC on the battery to below the RSOC threshold. In the third zone where the initial temperature is between 32.5° C. and 35° C., if the rate of temperature increase is lower than 0.25° C. per minute (slope $m<0.25$), then no action is taken, but if the rate of temperature increase exceeds 0.25° C. per minute ($m>0.25$), then the information handling system operates to reduce the RSOC on the battery to below the RSOC threshold. Finally, in the fourth zone where the initial temperature is above 35° C., if the rate of temperature increases at all, then the information handling system operates to reduce the RSOC on the battery to below the RSOC threshold.

In a next time period, from ten (10) minutes to twenty (20) minutes, three zones are implemented: initial temperature is less than 35° C., initial temperature is between 35° C. and 37.5° C., and initial temperature is above 37.5° C. When the initial temperature is below 35° C., the information handling system measures the rate of temperature increase, and if the rate of temperature increase is lower than 0.5° C. per minute (slope $m<0.5$), then no action is taken, but if the rate of temperature increase exceeds 0.5° C. per minute ($m>0.5$), then the information handling system operates to reduce the RSOC on the battery to below the RSOC threshold. In the second zone where the initial temperature is between 35° C. and 37.5° C., if the rate of temperature increase is lower than 0.25° C. per minute (slope $m<0.25$), then no action is taken, but if the rate of temperature increase exceeds 0.25° C. per minute ($m>0.25$), then the information handling system operates to reduce the RSOC on the battery to below the RSOC threshold. Finally, in the third zone where the initial temperature is above 37.5° C., if the rate of temperature increase at all, then the information handling system operates to reduce the RSOC on the battery to below the RSOC threshold. Then, at any time after twenty (20) minutes, if the temperature increases above 40° C., then the information handling system operates to reduce the RSOC on the battery to below the RSOC threshold.

In a particular embodiment, in any time period, the reduction of the RSOC on the battery may be triggered as soon as a time rate of temperature increase exceeds the particular slope (m) for the associated initial temperature. For example, if, in the first minute, or at any other time within the first time period, a battery that has a 25° C. initial temperature exhibits a time rate of temperature increase of greater than 1° C. per minute (slope $m>1.0$), the information handling system may operate to reduce the RSOC on the battery to below the RSOC threshold.

Returning to FIG. 1, in a particular embodiment, BMU 120 operates wholly with the elements of battery module 110 to provide the ABTP mode as described above. In another embodiment, BMU 120 operates to provide an indication to BMC 140 that the RSOC is above the RSOC threshold and that the time rate of temperature increase (m) is greater than the threshold slope associated with the initial temperature of battery module 110. Such an indication may be provided via the I2C interface. In this embodiment, BMC 140 operates to manage the operational settings of information handling system 100 to increase load ($R_L$) 130 in order to more rapidly reduce the RSOC on battery 112. For example, BMC 140 may operate to increase an operating frequency or an operating voltage for one or more component of information handling system 100 to increase the operating current of the components, to instantiate one or more additional workloads on the information handling system, or to otherwise increase load ($R_L$) 130 as needed or desired. Then, when BMU 120 detects that the RSOC of battery 112 had fallen below the RSOC threshold, the BMU provides an indication to BMC 140, and the BMC operates to reduce load ($R_L$) 130, as needed or desired.

In another embodiment, BMU 120 operates to provide the start temperature of battery module 110, the RSOC of battery 112, and the time rate of temperature increase (m) to BMC 140, and the BMC operates to determine whether or not the time rate of temperature increase (m) has exceeded a threshold. When the time rate of temperature increase (m) exceeds the threshold, BMC 140 operates to reduce the RSOC on battery 112. In a first case, BMC operates to direct BMU 120 to close switch (S) 116 to shed power through load ($R_D$) 114 until such time as the BMU indicates that the RSOC on battery 112 has reduced to below the RSOC threshold. In another case, BMC operates to increase load ($R_L$) 130 as described above. In another case, BMC 140 operates to provide charge shedding on battery 112 through a combination of switching on load ($R_D$) 114 and increasing load ($R_L$) 130, as needed or desired.

BMC 140 includes a BIOS application programming interface (API) 142, through which the BMC operates to monitor, manage, and maintain various BIOS settings for information handling system 100. In a particular embodiment, BMC 140 operates to enable the ABTP mode via a BIOS setting. The ABTP mode may be enabled in a manual mode or an automatic mode. In the manual mode, a user can adjust the various thresholds as needed or desired. For example, the user can adjust the initial temperature ranges, the time rate of temperature increase thresholds, the RSOC threshold, or the like. Further, the user can adjust an operating time to implement the ABTP mode. For example, it may be understood that the highest risk of overtemperature on battery module 110 is during the day time, between 10 AM and 6 PM. As such, the operating time for the enablement of the ABTP mode may be set to be between 10 AM and 6 PM, as needed or desired. In the automatic mode, a default set of thresholds and operating times may be utilized. In either mode, when BMU 120 manages the operation of the ABTP mode, BMC 140 operates to provide the threshold settings and operating times to BMU 120 via the I2C interface. Otherwise, BMC 140 operates to implement the settings and operating times as specified by the GIOS settings.

Figure 3:
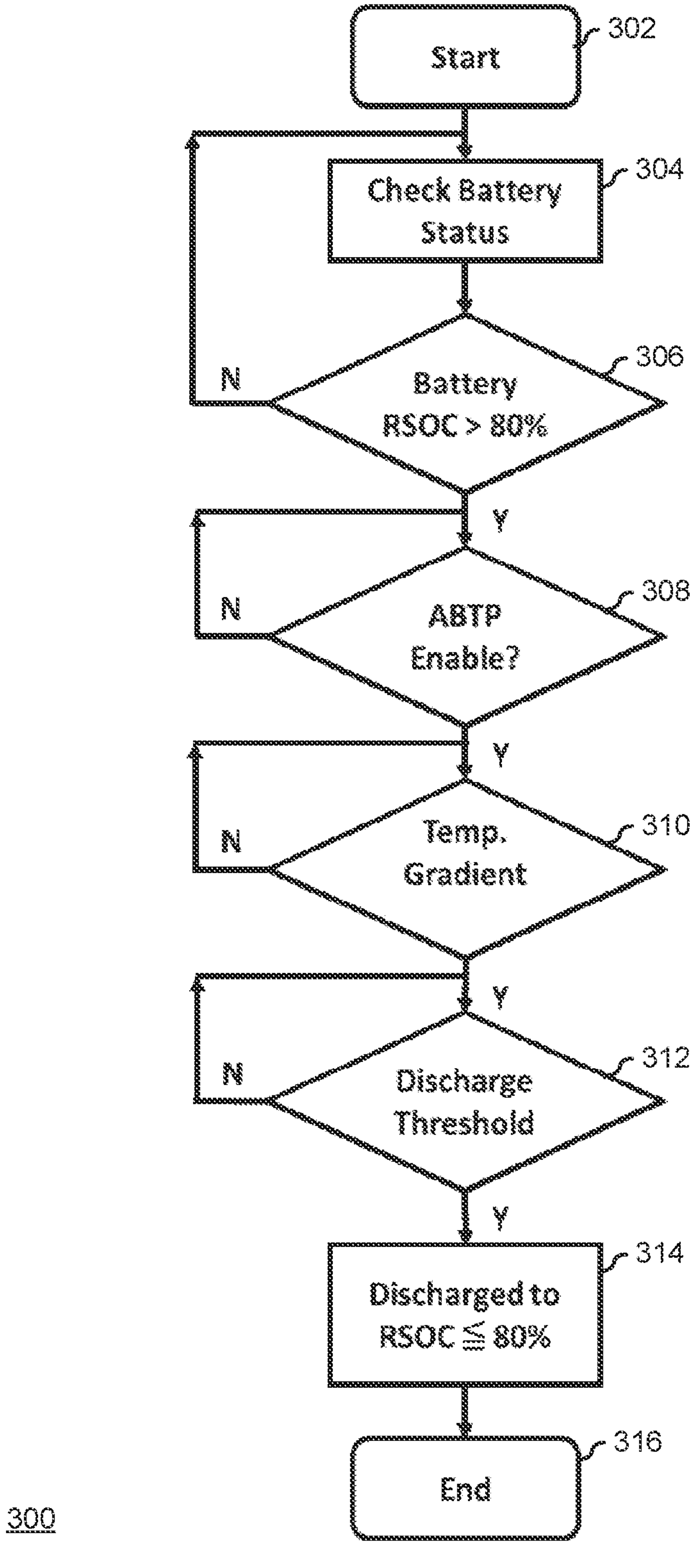
FIG. 3 is a flowchart illustrating a method for implementing an ABPT mode on an information handling system.

FIG. 3 illustrates a method 300 for implementing an ABPT mode on an information handling system, starting at block 302. A battery status is checked in block 304, and a decision is made as to whether or not the battery RSOC is greater than an RSOC threshold (e.g., 80%) in decision block 306. If not, the “NO” branch of decision block 306 is taken and the method returns to block 304 where the battery status is checked. If the battery RSOC is greater than the RSOC threshold, the “YES” branch of decision block 306 is taken and a decision is made as to whether or not the ABTP mode is enabled in decision block 308. If not, the “NO” branch of decision block 308 is taken and the method loops back to decision block 308 until the ABTP mode is enabled. When the ABTP mode is enabled, the “YES” branch of decision block 308 is taken and a decision is made as to whether or not a temperature gradient, such as a time rate of temperature change, is greater than a particular threshold in decision block 310. In this regard, decision block 310 may be understood to implement a particular decision profile as described above with reference to FIG. 2, taking into account the initial temperature of the battery, and the like.

If the temperature gradient is not greater than the particular threshold, the “NO” branch of decision block 310 is taken and the method loops back to decision block 310 until the temperature gradient exceeds the particular threshold. When the temperature gradient exceeds the particular threshold, the “YES” branch of decision block 310 is taken and a decision is made as to whether or not the battery is above a discharge threshold in decision block 312. If not, the “NO” branch of decision block 312 is taken and the method loops back to decision block 312 until the battery is above the discharge threshold. When the battery is above the discharge threshold, the “YES” branch of decision block 312 is taken, the battery is discharged to below the RSOC threshold in block 314, and the method ends in block 316.

Figure 4:
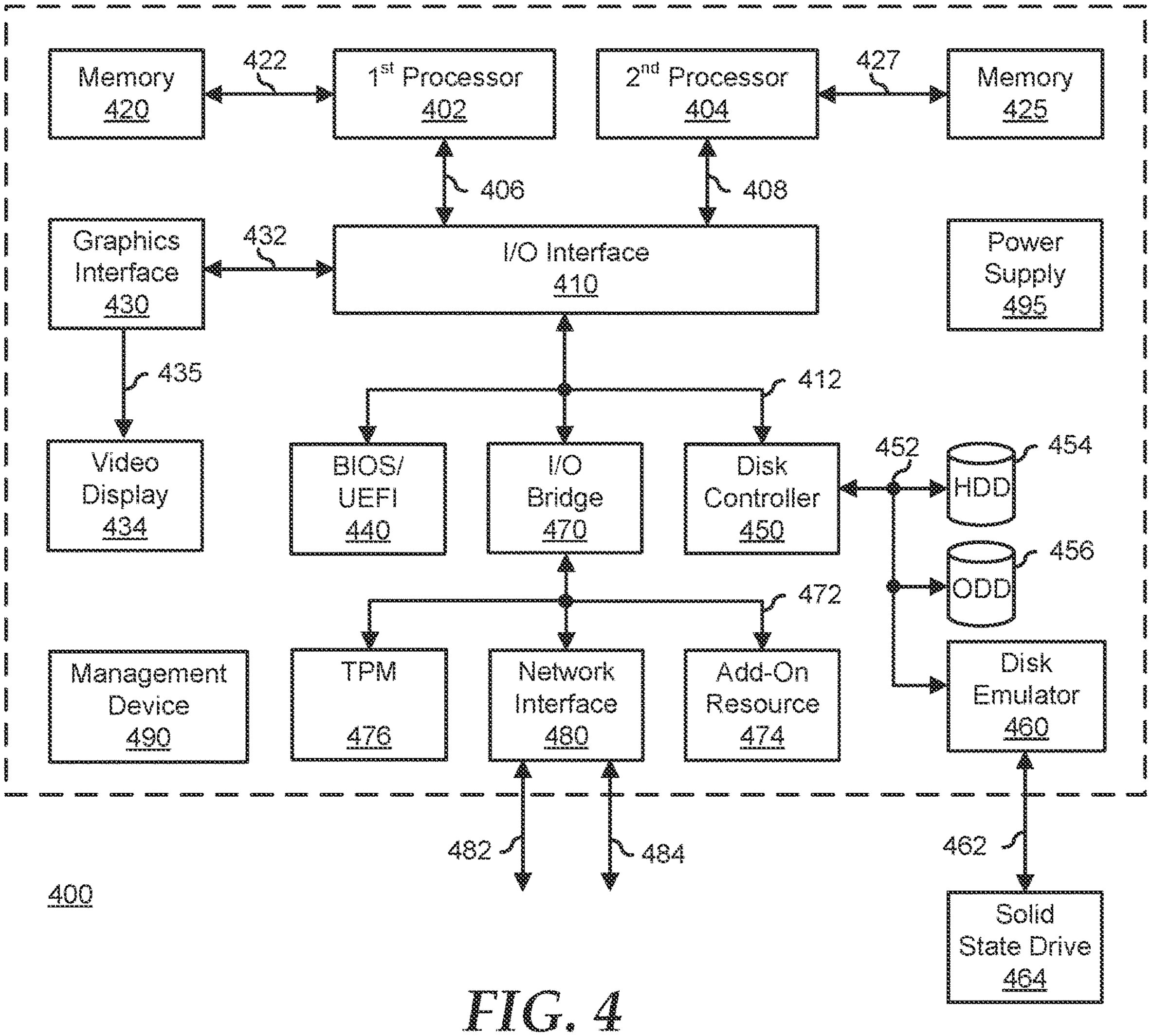
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 464, an I/O bridge 470, one or more add-on resources 474, a trusted platform module (TPM) 476, a network interface 480, a management device 490, and a power supply 495. Processors 402 and 404, I/O interface 410, memory 420 and 425, graphics interface 430, BIOS/UEFI module 440, disk controller 450, HDD 454, ODD 456, disk emulator 460, SSD 364, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 435 to a video display 434. In a particular embodiment, information handling system 400 includes separate memories that are dedicated to each of processors 402 and 404 via separate memory interfaces. An example of memories 420 and 425 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:

a battery; and a processor configured to determine that a relative state of charge (RSOC) on the battery is above a threshold RSOC, and when the RSOC is above the threshold RSOC, to determine that an initial temperature of the battery is within a first range, to determine that a time rate of temperature increase on the battery is greater than a first slope, the first slope being determined based upon the first range, and to discharge the battery to below the threshold RSOC in response to the determining that the time rate of temperature increase is greater than the first slope, wherein the processor receives the first range and the first slope from a BIOS application programming interface.

2. The information handling system of claim 1, further comprising:

a first load that is selectably coupled to the battery; and a second load coupled to the battery, the second load being associated with an operation of the information handling system.

3. The information handling system of claim 2, wherein, in discharging the battery, the processor is further configured to discharge the battery by coupling the first load to the battery.

4. The information handling system of claim 2, wherein, in discharging the battery, the processor is further configured to discharge the battery by increasing a current on the second load.

5. The information handling system of claim 2, wherein, in discharging the battery, the processor is further configured to discharge the battery by coupling the first load to the battery and by increasing a current on the second load.

6. The information handling system of claim 1, wherein the processor includes a battery management unit associated with the battery.

7. The information handling system of claim 1, wherein the processor includes a baseboard management controller.

8. The information handling system of claim 7, wherein the baseboard management controller includes the BIOS application programming interface.

9. The information handling system of claim 1, wherein the processor is further configured, when the RSOC is above the RSOC threshold, to determine that the initial temperature of the battery is within a second range, to determine that the time rate of temperature increase is greater than a second slope, the second slope being determined based upon the second range, and to discharge the battery to below the threshold RSOC in response to the determining that the time rate of temperature increase is greater than the second slope.

10. A method, comprising:

determining, by a processor of an information handling system, that a relative state of charge (RSOC) on a battery of the information handling system is above a threshold RSOC; and when the RSOC is above the RSOC threshold:

determining that an initial temperature of the battery is within a temperature range;

determining that a time rate of temperature increase on the battery is greater than a first slope, the first slope being determined based upon the first range; and discharging the battery to below the threshold RSOC in response to the determining that the time rate of temperature increase is greater than the first slope;

wherein the processor receives the first range and the first slope from a BIOS application programming interface.

11. The method of claim 10, further comprising:

selectably coupling a first load to the battery; and coupling a second load to the battery, the second load being associated with an operation of the information handling system.

12. The method of claim 11, wherein, in discharging the battery, the method further comprises:

discharging the battery by coupling the first load to the battery.

13. The method of claim 11, wherein, in discharging the battery, the method further comprises:

discharging the battery by increasing a current on the second load.

14. The method of claim 11, wherein, in discharging the battery, the method further comprises:

discharging the battery by coupling the first load to the battery and by increasing a current on the second load.

15. The method of claim 10, wherein the processor includes a battery management unit associated with the battery.

16. The method of claim 10, wherein the processor includes a baseboard management controller.

17. The method of claim 16, wherein the baseboard management controller includes the BIOS application programming interface.

18. An information handling system, comprising:

a baseboard management controller a battery module including a battery and a battery management unit, wherein the battery management unit is configured, when a relative state of charge (RSOC) of the battery is above a threshold RSOC, to determine that an initial temperature of the battery is within a first range, to determine that a time rate of temperature increase on the battery is greater than a first slope, the first slope being determined based upon the first range, to discharge the battery to below the threshold RSOC in response to the determining that the time rate of temperature increase is greater than the first slope, and to provide an indication to the baseboard management controller that the battery is being discharged, wherein the baseboard management controller receives the first range and the first slope from a BIOS application programming interface.

* * * * *